(12) United States Patent
Zhang et al.

(10) Patent No.: US 10,877,099 B2
(45) Date of Patent: Dec. 29, 2020

(54) METHOD AND DEVICE FOR TESTING BATTERY EQUALIZATION CIRCUIT

(71) Applicant: BEIJING ELECTRIC VEHICLE CO., LTD., Beijing (CN)

(72) Inventors: Qianhui Zhang, Beijing (CN); Liguo Yan, Beijing (CN); Xingquan Qin, Beijing (CN); Zhongke Yang, Beijing (CN); Huigen Yu, Beijing (CN); Donglin Cao, Beijing (CN); Rui Liang, Beijing (CN); Dangqing Li, Beijing (CN); Zhiqiang Guo, Beijing (CN)

(73) Assignee: BEIJING ELECTRIC VEHICLE CO., LTD., Beijing (CN)

( * ) Notice: Subject to any disclaimer, the term of this patent is extended or adjusted under 35 U.S.C. 154(b) by 323 days.

(21) Appl. No.: 15/771,353

(22) PCT Filed: Oct. 26, 2016

(86) PCT No.: PCT/CN2016/103412
§ 371 (c)(1),
(2) Date: Apr. 26, 2018

(87) PCT Pub. No.: WO2017/071589
PCT Pub. Date: May 4, 2017

(65) Prior Publication Data
US 2018/0313898 A1    Nov. 1, 2018

(30) Foreign Application Priority Data

Oct. 27, 2015   (CN) .......................... 2015 1 0708734

(51) Int. Cl.
*H02J 7/06*         (2006.01)
*G01R 31/36*     (2020.01)
(Continued)

(52) U.S. Cl.
CPC .......... *G01R 31/36* (2013.01); *H01M 10/482* (2013.01); *H02J 7/0016* (2013.01); *H02J 7/0018* (2013.01);
(Continued)

(58) Field of Classification Search
CPC ........ H02J 7/008; H02J 7/0072; H02J 7/0031; H02J 7/0068; H02J 7/022
See application file for complete search history.

(56) References Cited

U.S. PATENT DOCUMENTS

| | | | |
|---|---|---|---|
| 2012/0038321 A1* | 2/2012 | Cheng ................. | H01M 10/482 320/116 |
| 2013/0108905 A1* | 5/2013 | Murakami .......... | H01M 10/425 429/90 |
| 2014/0111160 A1* | 4/2014 | Nozawa ............. | G01R 31/3835 320/118 |

FOREIGN PATENT DOCUMENTS

| | | |
|---|---|---|
| CN | 204044308 | 12/2014 |
| CN | 104407302 | 3/2015 |

(Continued)

OTHER PUBLICATIONS

International Search Report for PCT/CN2016/103412, dated Feb. 7, 2017.
Written Opinion of PCT/CN2016/103412, dated Jan. 23, 2017.

*Primary Examiner* — Arun C Williams
(74) *Attorney, Agent, or Firm* — B. Aaron Schulman, Esq.; Stites & Harbison, PLLC

(57) ABSTRACT

Disclosed are a device and a method for testing a battery equalization circuit. The device includes: multiple voltage supply modules, each of which being connected to a corresponding equalization module to form multiple test loops, and being configured to supply simulated voltage of the battery cell to a corresponding equalization module; multiple equalization current detection modules, each of which (Continued)

being configured to detect equalization current of each test loop; multiple switch assemblies and multiple leakage current detection modules, each switch assembly being connected in parallel with a corresponding leakage current detection module, and each leakage current detection module being configured to detect leakage current generated by a corresponding equalization module when the leakage current detection module is connected into a corresponding test loop; and a control module, configured to control each switch assembly and each equalization module to detect the equalization current and the leakage current of each test loop.

15 Claims, 5 Drawing Sheets

(51) Int. Cl.
     *H02J 7/00*        (2006.01)
     *H01M 10/48*     (2006.01)
     *H01M 10/42*     (2006.01)

(52) U.S. Cl.
     CPC ... *H02J 7/0021* (2013.01); *H01M 2010/4271* (2013.01)

(56) References Cited

FOREIGN PATENT DOCUMENTS

| | | |
|---|---|---|
| JP | 2008011657 | 1/2008 |
| JP | 2013094032 | 5/2013 |

* cited by examiner

METHOD AND DEVICE FOR TESTING BATTERY EQUALIZATION CIRCUIT

CROSS REFERENCE TO RELATED APPLICATIONS

This application is a U.S. national phase application of International Application No. PCT/CN2016/103412, which is based on and claims priority to Chines Patent Application No. 201510708734.X, filed on Oct. 27, 2015, the entire contents of which are incorporated herein by reference.

FIELD

The present disclosure relates to the battery technology field, and more particularly to a device and a method for testing a battery equalization circuit.

BACKGROUND

Inconsistence of a lithium ion power battery in an electric vehicle has adverse effect on a life of the power battery and a usage of a battery management system. Thus, during using the power battery, there is a need to perform active or passive equalization on the battery, so as to prolong the life of the battery. FIG. 1 illustrates a common principle of a passive equalization circuit, in which the passive equalization may be performed by controlling the MOS transistor to turn on or off.

In order to ensure a production quality of the battery management system BMS, there is a need to test the equalization circuit. In the related art, it is possible to directly simulate a voltage of a battery cell by a voltage source, so as to simulate failures of the cell voltage such as overvoltage or undervoltage, and when the power supply is in a voltage source mode, the equalization ability of the equalization circuit and the leakage current which may exist when the MOS transistor is turned off can be detected. A test principle of the equalization circuit is as illustrated in FIG. 2. When it needs to the detect the equalization current, the MOS transistor is turned on, and the equalization current is measured by the ampere meter A; when it needs to detect the leakage current, the MOS transistor is turned off, and the leakage current of the MOS transistor is measured by the ampere meter A.

However, the disadvantages in the related art are in that, the equalization current of the leakage current of the MOS transistor are directly measured by the same ampere meter. The equalization current is very large, which is generally about 500 mA or even larger. However, the leakage current of the MOS transistor is typically very small, which is generally less than 0.2 mA. It is difficult for the measurement accuracy of the ampere meter to satisfy this requirement. Even if the ampere meter can ensure such a wide range of current measurement accuracy, the cost of the ampere meter is very high.

SUMMARY

The present disclosure aims to solve at least one of problems in the related art to at least some extent.

Embodiments of an aspect of the present disclosure provide a device for testing a battery equalization circuit. The battery equalization circuit includes a plurality of equalization modules connected in series, and each equalization module is corresponding to one battery cell. The device includes: a plurality of voltage supply modules, wherein each of the plurality of voltage supply modules is connected to a corresponding equalization module, so as to form a plurality of test loops, and each of the plurality of voltage supply modules is configured to simulate a voltage of the battery cell and to supply the voltage to a corresponding equalization module; a plurality of equalization current detection modules, wherein each of the plurality of equalization current detection modules is configured to detect equalization current of each test loop; a plurality of switch assemblies and a plurality of leakage current detection modules, wherein each of the plurality of switch assemblies is connected in parallel with a corresponding one of the plurality of leakage current detection modules to control a connection state of the corresponding one of the plurality of leakage current detection modules, and each of the plurality of leakage current detection modules is configured to detect leakage current generated by a corresponding equalization module when the leakage current detection module is connected into a corresponding test loop; and a control module, configured to control each of the plurality of switch assemblies and each of the plurality of equalization modules so as to detect the equalization current and the leakage current of each test loop.

Embodiments of another aspect of the present disclosure provide a method for testing a battery equalization circuit. The battery equalization circuit includes a plurality of equalization modules connected in series, each equalization module is corresponding to one battery cell, each of the plurality of equalization modules is connected to a corresponding voltage supply module, so as to form a plurality of test loops, each of the plurality of voltage supply modules is configured to simulate a voltage of the battery cell and to supply the voltage to a corresponding equalization module, and the method includes: detecting equalization current of each test loop by a corresponding equalization current detection module; detecting leakage current generated by the equalization module by a corresponding leakage current detection module when the corresponding leakage current detection module is connected into the corresponding test loop, in which the leakage current detection module is connected into the corresponding test loop via a corresponding switch assembly; and controlling each switch assembly and each of the plurality of equalization modules to detect the equalization current and the leakage current of each test loop.

EMBODIMENTS OF THE PRESENT DISCLOSURE

Reference will now be made in detail to exemplary embodiments, examples of which are illustrated in accompanying drawings, in which the same or similar reference numbers throughout the drawings represent the same or similar elements or elements having same or similar functions. Embodiments described below with reference to drawings are merely exemplary and used for explaining the present disclosure, and should not be understood as limitation to the present disclosure.

A device for testing a battery equalization circuit and a method for testing a battery equalization circuit according to embodiments of the present disclosure will be described below with reference to accompanying drawings.

Figure 1:
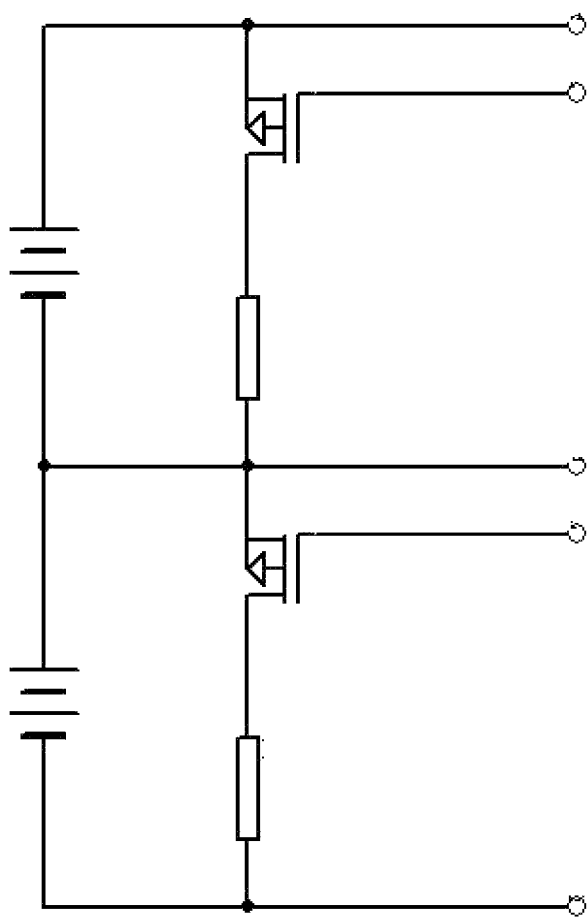
FIG. 1 is a schematic diagram illustrating a principle of a battery equalization circuit in the related art.
Figure 2:
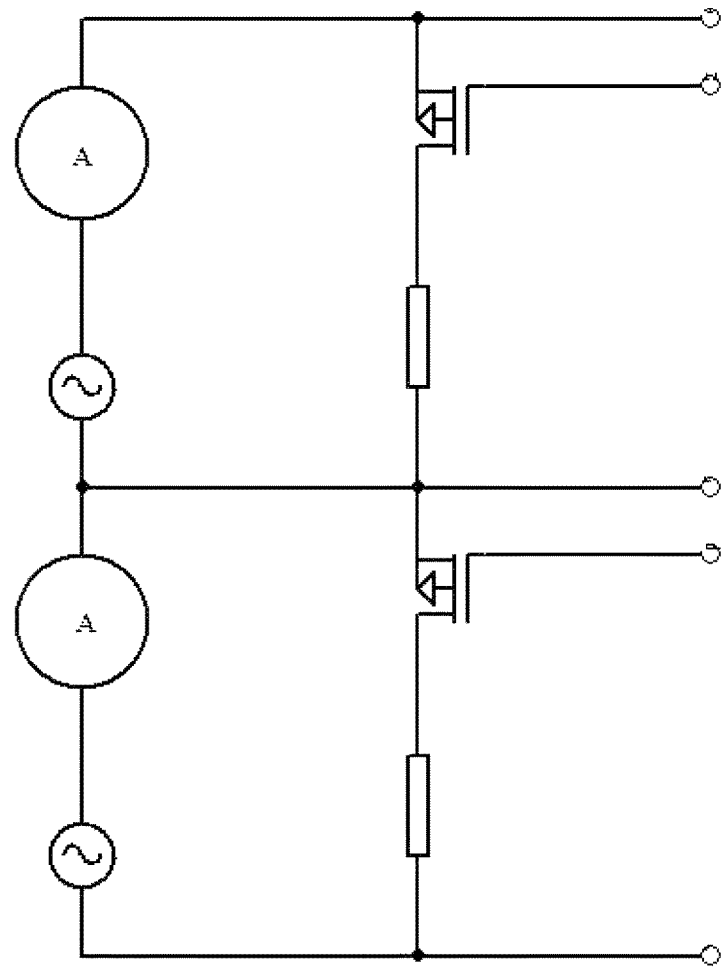
FIG. 2 is a schematic diagram illustrating a circuit principle of a test scheme for a battery equalization circuit in the related art.
Figure 3:
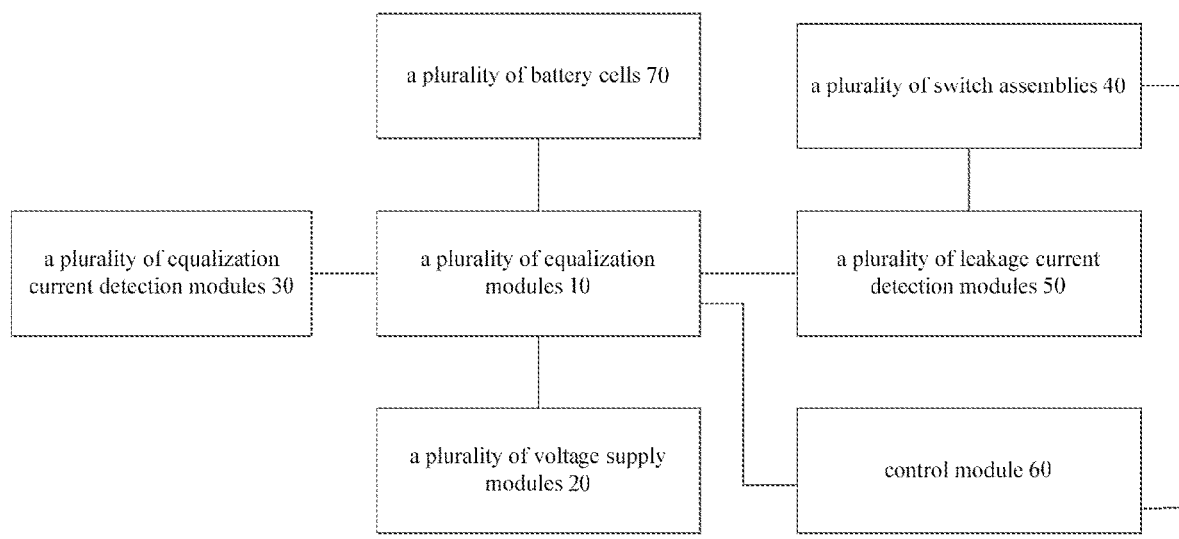
FIG. 3 is a block diagram of a device for testing a battery equalization circuit according to an embodiment of the present disclosure.
Figure 4:
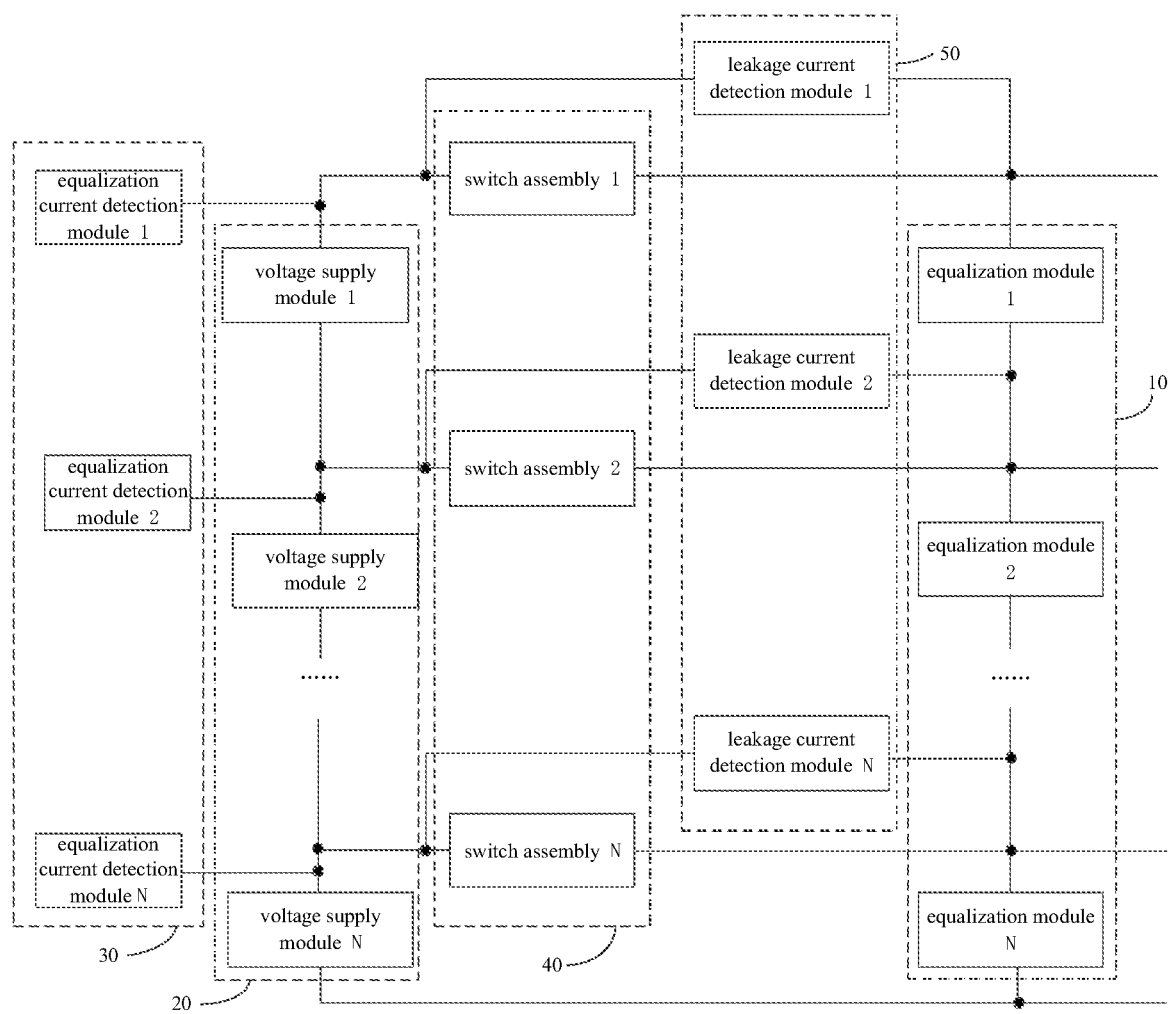
FIG. 4 is a block diagram a device for testing a battery equalization circuit according to embodiments of the present disclosure.

FIG. 3 is a block diagram of a device for testing a battery equalization circuit according to an embodiment of the present disclosure. FIG. 4 is a schematic diagram of a device for testing a battery equalization circuit according to an embodiment of the present disclosure. As illustrated in FIG. 3 and FIG. 4, the battery equalization circuit includes a plurality of equalization modules 10. The plurality of equalization modules 10 are connected in series. Each equalization module 10 is corresponding to one battery cell 70. The device includes a plurality of voltage supply modules 20, a plurality of equalization current detection modules 30, a plurality of switch assemblies 40, a plurality of leakage current detection modules 50 and a control module 60.

Each of the plurality of voltage supply modules 40 is connected to a corresponding equalization module 10, such that a plurality of test loops are formed. Each of the plurality of voltage supply modules 20 is configured to simulate a voltage of the battery cell 70 and to supply the voltage to the corresponding equalization module 10. Each of the plurality of equalization current detection modules 30 is configured to detect equalization current of each test loop. Each of the plurality of switch assemblies 40 is connected in parallel with a corresponding one of the plurality of leakage current detection modules 50 to control a connection state of the corresponding one of the plurality of leakage current detection modules 50. Each leakage current detection module 50 is configured to detect leakage current generated by a corresponding equalization module 10 when the leakage current detection module 50 is connected into the corresponding test loop.

The control module 60 is configured to control each switch assembly 40 and each equalization module 10 to detect the equalization current and the leakage current of each test loop. In other words, the control module 50 can output a plurality of switch control signals and a plurality of equalization control signals. Each of the plurality of switch control signal is outputted to a corresponding one of the plurality of switch assemblies 40 to control the corresponding switch assembly to turn on or off. Each of the plurality of equalization control signals is outputted to a corresponding one of the plurality of equalization modules 10 to control the corresponding equalization module to turn on or off.

It would be understood that, when a different test loop is detected, the control module controls each switch assembly and each equalization module to be in a different on-off state, and when the equalization current and the leakage current of the same test loop are detected, the control module controls the corresponding switch assembly and equalization module to be in a different on-off state.

When the device starts testing and is initialized, the control module can detect the equalization current and the leakage current of the plurality of test loops in sequence. For example, the equalization current and the leakage current of the first test loop may be detected first, and then the equalization current and the leakage current of the second test loop and other test loops can be detected in sequence.

Therefore, large current of the equalization current is detected by the equalization current detection module, and small current of the leakage current is detected by the leakage current detection module, such that both measurement requirement for the large current of the equalization current and measurement requirement for the small current of the leakage current can be achieved, thus realizing accurate detection of the equalization current and the leakage current, and realizing low cost.

In detail, according to a specific embodiment of the present disclosure, each leakage current detection module includes a sampling resistor and a voltmeter. The sampling resistor is connected in parallel with the corresponding switch assembly. In an example of the present disclosure, the sampling resistor can be a high-precision resistor. The voltmeter is connected in parallel with the sampling resistor, and the voltmeter is configured to detect a voltage over the sampling resistor to measure the leakage current generated by the corresponding equalization module.

Further, each switch assembly includes a relay. A switch of the relay is connected in the corresponding test loop. The switch of the relay is also connected in parallel with the corresponding sampling resistor. A first end of a coil of the relay is grounded, and a second end of the coil of the relay is connected with the control module via a drive unit.

Further, each equalization module includes a load resistor and a MOS transistor (Metal Oxide Semiconductor Field Effect Transistor) connected in series.

According to a specific example of the present disclosure, each of the plurality of voltage supply modules 20 may be a voltage source, and each of the plurality of equalization current detection modules 30 may be an external ampere meter or a built-in current measurement unit of the voltage source. When the equalization current detection module is the external ampere meter, the external ampere meter may be connected in series with the corresponding voltage source to detect the equalization current.

In addition, the control module may include a first control unit and a second control unit. The first control unit may control the MOS transistor in each equalization module. The second control unit may control the relay switch in each switch assembly. Both the first control unit and the plurality of equalization modules 10 are provided inside the BMS (battery management system).

In the following, the specific structure and working principle of the device for testing a battery equalization circuit according to embodiments of the present disclosure will be described in detail by taking two equalization modules connected in series as an example and with reference to FIG. 5.

Figure 5:
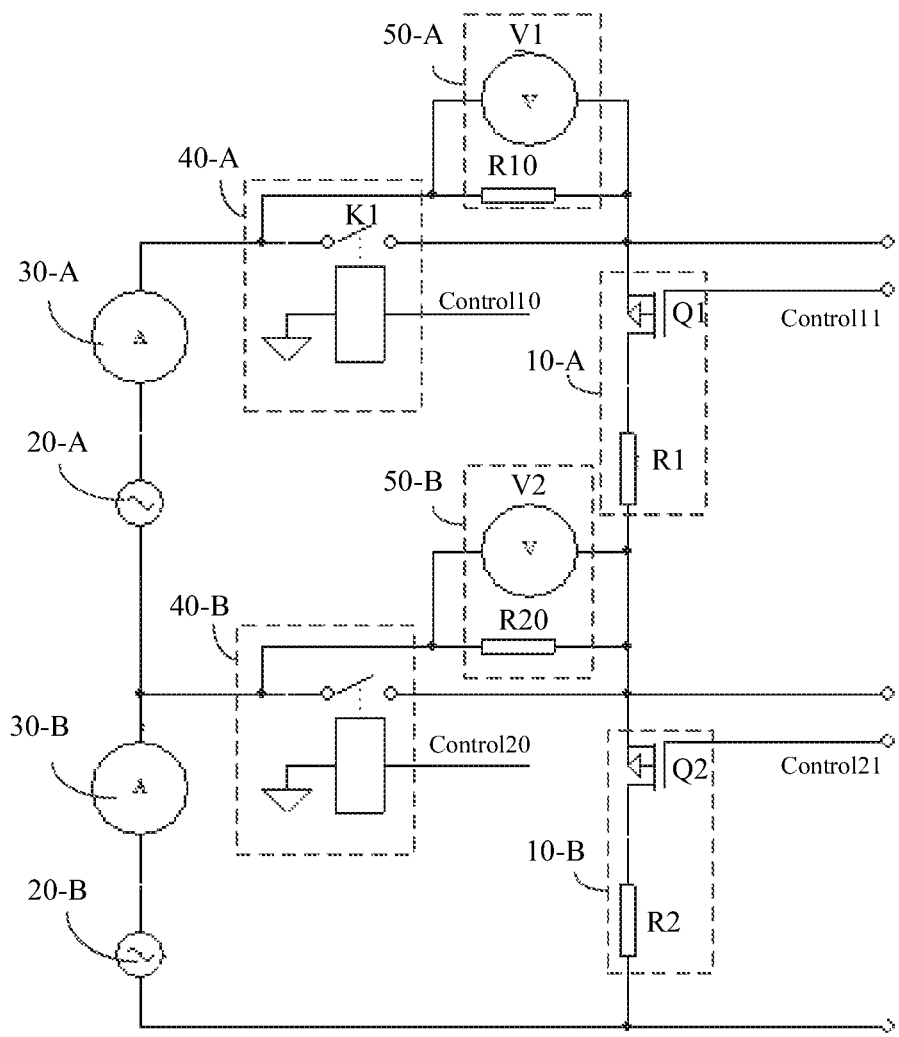
FIG. 5 is a schematic diagram illustrating a circuit principle of a device for testing a battery equalization circuit according to an embodiment of the present disclosure.

According to an embodiment of the present disclosure, as illustrated in FIG. 5, when the plurality of equalization modules include a first equalization module 10-A and a second equalization module 10-B, the plurality of voltage supply modules 20 include a first voltage supply module 20-A and a second voltage supply module 20-B, the plurality of equalization current detection modules 30 include a first equalization current detection module 30-A and a second equalization current detection module 30-B, the plurality of switch assemblies include a first switch assembly 40-A and a second switch assembly 40-B, and the plurality of leakage current detection modules 50 include a first leakage current detection module 50-A and a second leakage current detection module 50-B.

A gate Control 11 of a first MOS transistor Q1 in the first equalization module 10-A is connected with the control module, and a drain of the first MOS transistor Q1 is connected with a first end of a first load resistor R1 in the first equalization module 10-A. A first end of a coil of a first relay in the first switch assembly 40-A is grounded, and a second end Control 10 of the coil of the first relay is connected with the control module via a first drive unit. A first end of s switch K1 of the first relay is connected with a source of the first MOS transistor Q1. A first end of the first equalization current detection module 30-A is connected with a second end of the switch K1 of the first relay. A first end of the first voltage supply module 20-A is connected with a second end of the first equalization current detection module 30-A.

A gate Control 21 of a second MOS transistor Q2 in the second equalization module 10-B is connected with the control module, a source of the second MOS transistor Q2 is connected with a second end of the first load resistor R1, and a drain of the second MOS transistor Q2 is connected with a first end of a second load resistor R2 in the second equalization module 10-B, in which a first node exists between the second MOS transistor Q2 and the first load resistor R1. A first end of a coil of a second relay in the second switch assembly 40-B is grounded, and a second end Control 20 of the coil of the second relay is connected with the control module via a second drive unit. A first end of a switch K2 of the second relay is connected with the first node. A first end of the second equalization current detection module 30-B is connected with a second end of the first voltage supply module 20-A, in which a second node exists between the second equalization current detection module 30-B and the first voltage supply module 20-A. A second end of the switch K2 of the second relay is connected with the second node. A first end of the second voltage supply module 20-B is connected with a second end of the second equalization current detection module 30-B, and a second end of the voltage supply module 20-B is connected with a second end of the second load resistor R2.

A first sampling resistor R10 in the first leakage current detection module 50-A is connected in parallel with the switch K1 of the first relay. A first voltmeter V1 in the first leakage current detection module 50-A is connected in parallel with the first sampling resistor R10. A second sampling resistor R20 in the second leakage current detection module 50-B is connected in parallel with the switch K2 of the second relay. A second voltmeter V2 in the second leakage current detection module 50-B is connected in parallel with the second sampling resistor R20.

In detail, when the control module controls the first MOS transistor, the switch of the first relay and the switch of the second relay to turn on, the equalization current in a first test loop formed by the first voltage supply module 20-A, the first MOS transistor Q1, and the first load resistor R1 is detected by the first equalization current detection module 30-A. when the control module controls the first MOS transistor Q1 and the switch K1 of the first relay to turn off and controls the switch K2 of the second relay to turn on, the leakage current of the first MOS transistor Q1 is detected by the first voltmeter V1.

When the control module controls the second MOS transistor Q2 and the switch K2 of the second relay to turn on, the equalization current in a second test loop formed by the second voltage supply module 20-B, the second MOS transistor Q2 and the second load resistor R2 is detected by the second equalization current detection module 30-B. When the control module controls the second MOS transistor Q2 and the switch K2 of the second relay to turn off, the leakage current of the second MOS transistor Q2 is detected by the second voltmeter V2.

In detail, after the initialization of the test device, each MOS transistor is turned off, and the switch of each relay is turned off. When the equalization current of the first test loop is detected, the first control unit in the control module can first control the first MOS transistor Q1 to turn on, and the second control unit in the control module can control the switch K1 of the first relay and the switch K2 of the second relay to turn on, such that the measurement device can detect the equalization current in the first test loop by the first equalization current detection module 30-A. Then, when the leakage current of the first test loop is detected, the first control unit can control the first MOS transistor Q1 to turn off, and the second control unit can control the switch K1 of the first relay to turn off and control the switch K2 of the second relay to turn on, such that the measurement device can detect the leakage current of the first MOS transistor Q1 by the first voltmeter V1.

Similarly, when the equalization current of the second test loop is detected, the first control unit can first control the second MOS transistor Q2 to turn on, and the second control unit can control the switch K2 of the second relay to turn on, such that the measurement device can detect the equalization current in the second test loop by the second equalization current detection module 30-B. Then, when the leakage current of the second test loop is detected, the first control unit can control the second MOS transistor Q2 to turn off, and the second control unit can control the switch K2 of the second relay to turn off, such that the measurement device can detect the leakage current of the second MOS transistor Q2 by the second voltmeter V2.

Thus, the large current of equalization current can be detected by the current measurement unit or external ampere meter of the voltage source, which can satisfy the measurement requirement for the large current of equalization current; the small current of leakage current can be detected by performing voltage dividing through the high-precision resistor and detecting the divided voltage through the voltmeter, which can satisfy the measurement requirement for the small current of leakage current of the MOS transistor. The comprehensive implementation cost is low.

In conclusion, with the device for testing a battery equalization circuit provided by embodiments of the present disclosure, each of the plurality of voltage supply modules is connected to a corresponding equalization module, so as to form a plurality of test loops, the equalization current of each test loop is detected by each of the plurality of the plurality of equalization current detection modules, each of the plurality of switch assemblies is connected in parallel with a corresponding one of the plurality of leakage current detection modules to control the connection state of the corresponding one of the plurality of leakage current detection modules, the leakage current generated by the equalization module is detected by the corresponding leakage current detection module when the leakage current detection module is connected into the corresponding test loop, and the control module controls each switch assembly and each equalization module to detect to the equalization current and the leakage current of each test loop. Thus, large current of the equalization current is detected by the equalization current detection module, and small current of the leakage current is detected by the leakage current detection module, such that both the measurement requirement for large current of the equalization current and the measurement requirement for small current of the leakage current of the MOS transistor can be satisfied, thus realizing accurate detection of the equalization current and the leakage current, and realizing low cost.

Embodiments of the present disclosure further provide a method for testing a battery equalization circuit.

Figure 6:
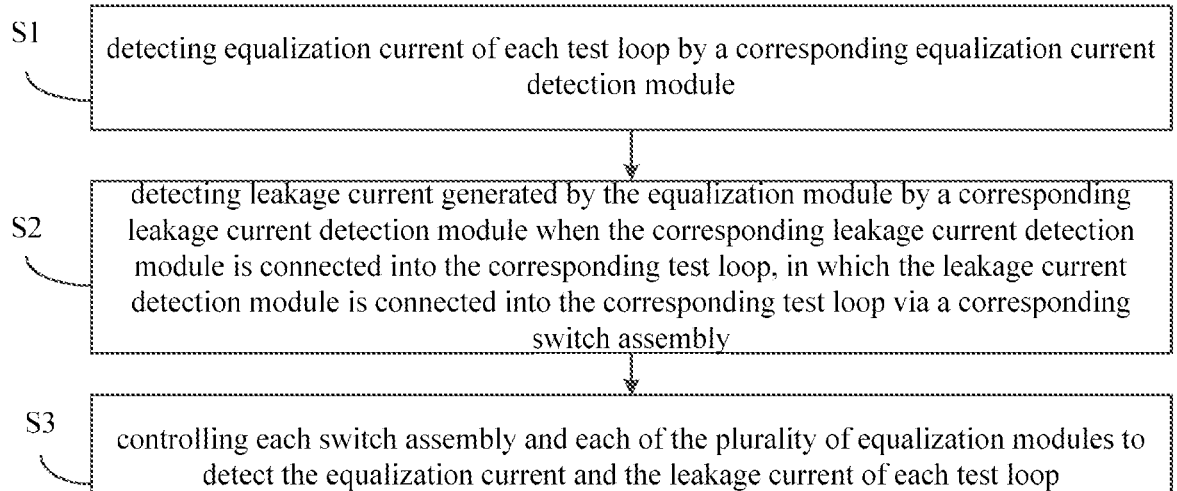
FIG. 6 is a flow chart of a method for testing a battery equalization circuit according to an embodiment of the present disclosure.

FIG. 6 is a flow chart of a method for testing a battery equalization circuit according to an embodiment of the present disclosure. The battery equalization circuit includes a plurality of equalization modules connected in series, and each equalization module is corresponding to one battery cell. Each of the plurality of equalization modules is connected to a corresponding voltage supply module, so as to form a plurality of test loops. Each voltage supply module is configured to simulate a voltage of the battery cell and to supply the voltage to a corresponding equalization module. As illustrated in FIG. 6, the method for testing a battery equalization circuit according to an embodiment of the present disclosure includes following actions.

At S1, equalization current of each test loop is detected by a corresponding equalization current detection module.

At S2, leakage current generated by the equalization module is detected by a corresponding leakage current detection module when the corresponding leakage current detection module is connected into the corresponding test loop. In an embodiment, the leakage current detection module is connected into the corresponding test loop via a corresponding switch assembly.

At S3, each switch assembly and each of the plurality of equalization modules are controlled to detect the equalization current and the leakage current of each test loop.

According to an embodiment of the present disclosure, when the plurality of equalization modules include a first equalization module and a second equalization module, there are a first voltage supply module and a second voltage supply module, a first equalization current detection module and a second equalization current detection module, a first switch assembly and a second switch assembly, and a first leakage current detection module and a second leakage current detection module.

Controlling each switch assembly and each of the plurality of equalization modules to detect the equalization current and the leakage current of each test loop (i.e., S3) specifically includes: controlling a first MOS transistor in the first equalization module, a switch of a first relay in the first switch assembly and a switch of a second relay in the second switch assembly to turn on, and detecting the equalization current in a first test loop formed by the first voltage supply module and the first equalization module by the first equalization current detection module; and controlling the first MOS transistor and the switch of the first relay to turn off and controlling the switch of the second relay to turn on, and detecting the leakage current of the first MOS transistor by a first voltmeter in the first leakage current detection module.

Moreover, controlling each switch assembly and each of the plurality of equalization modules to detect the equalization current and the leakage current of each test loop (i.e., S3) specifically includes: controlling a second MOS transistor in the second equalization module and a switch of a second relay in the second switch assembly to turn on, and detecting the equalization current in a second test loop formed by the second voltage supply module and the second equalization module by the second equalization current detection module; and controlling the second MOS transistor and the switch of the second relay to turn off, and detecting the leakage current of the second MOS transistor by a second voltmeter in the second leakage current detection module.

Figure 7:
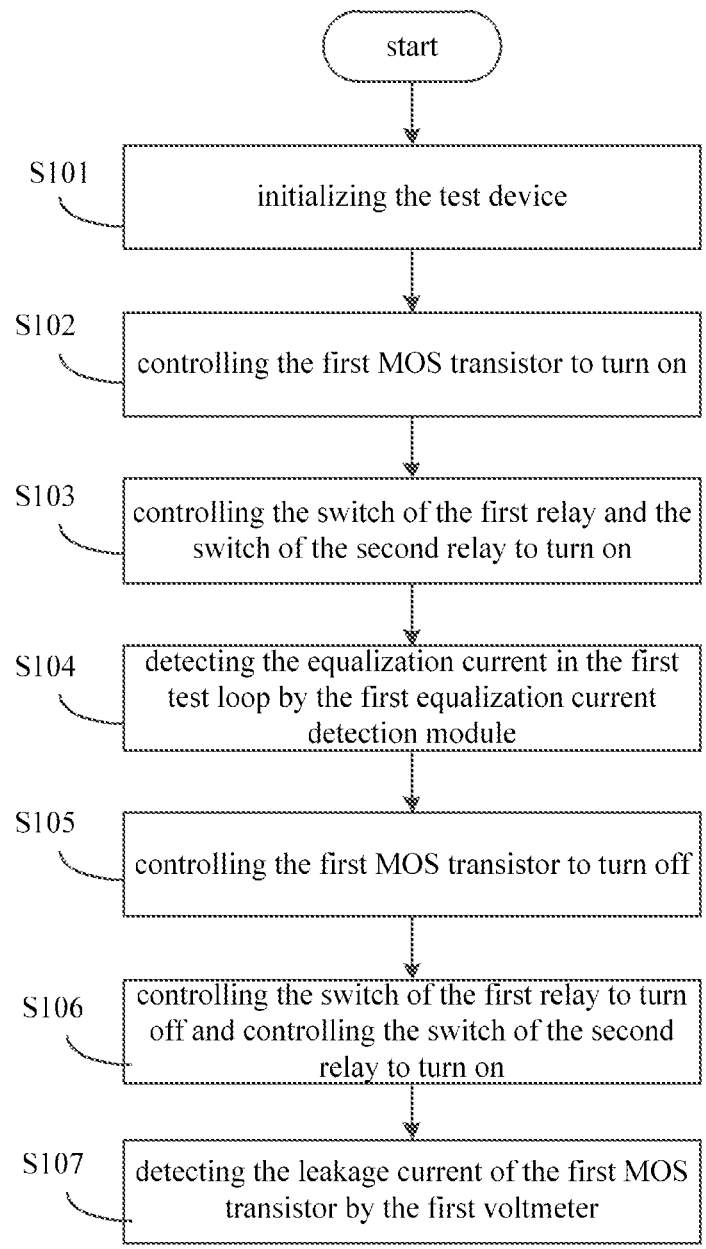
FIG. 7 is a flow chart of a method for testing a battery equalization circuit according to a specific embodiment of the present disclosure.

In detail, as illustrated in FIG. 7, taking the first test loop as an example, the test method includes following steps.

At S101, the test device is initialized.

At S102, the first MOS transistor is controlled to turn on.

At S103, the switch of the first relay and the switch of the second relay are controlled to turn on.

At S104, the equalization current in the first test loop is detected by the first equalization current detection module.

At S105, the first MOS transistor is controlled to turn off.

At S106, the switch of the first relay is controlled to turn off and the switch of the second relay is controlled to turn on.

At S107, the leakage current of the first MOS transistor is detected by the first voltmeter.

In this way, the test result of the first test loop is obtained. Then, the second test loop is detected in a similar way.

In conclusion, with the method for testing a battery equalization circuit provided by embodiments of the present disclosure, the equalization current of each test loop is detected by each of the plurality of equalization current detection modules, and the leakage current of the equalization module is detected by the corresponding leakage current detection module when the corresponding leakage current detection module is connected into the corresponding test loop, and the control module controls each switch assembly and each equalization module to detect the leakage current and the equalization current of each test loop. Therefore, large current of the equalization current is detected by the equalization current detection module, and small current of the leakage current is detected by the leakage current detection module, such that both the measurement requirement for large current of the equalization current and the measurement requirement for small current of the leakage current of the MOS transistor can be satisfied, thus realizing accurate detection of the equalization current and the leakage current, and realizing low cost.

It is to be understood that, in the description of the specification, orientation or position relationship indicated by terms such as "center", "longitudinal", "lateral", "length", "width", "thickness", "up", "down", "front", "rear", "left", "right", "vertical", "horizontal", "top", "bottom", "inside", "outside", "clockwise", "anticlockwise", "axial", "radial" and "circumferential" is the orientation or position relationship illustrated based on drawings, and are only used to simplify description of the present invention, and do not indicate or imply that the device or element referred to must have or operated in a particular orientation. They cannot be seen as limits to the present disclosure.

Moreover, terms of "a first" and "a second" are only used for description and cannot be seen as indicating or implying relative importance or implying the number of technical features referred to. Thus, a feature defined with "a first" and "a second" may indicate or imply including at least one the feature. In the description of the specification, "a plurality of" means more than two, for example, two, three, and the like, unless otherwise stipulated and restricted.

In the present disclosure, unless otherwise stipulated and restricted, it is to be explained that terms of "installation", "linkage", "connection" and "fixation" shall be understood broadly, for example, it could be permanent connection, removable connection or integral connection; it could be mechanical connection, or electrical connection; it could be direct linkage, indirect linkage via intermediate medium, inside linkage within two elements or interactive relationship of two elements. Those of ordinary skill in the art shall understand the concrete notations of the terms mentioned above according to specific circumstances.

In the present disclosure, unless otherwise stipulated and restricted, the first feature being "on" or "below" the second feature may be the first feature being in direct contact with the second feature, or the first feature being in indirect contact with the second feature via intermediate medium. Moreover, the first feature being "on", "over" or "above" the second feature may be the first feature being exactly or inclinedly above the second feature, or merely indicates that the horizontal height of the first feature is higher than that of the second feature. The first feature "below", "under" or "underneath" the second feature may be the first feature being exactly or inclinedly below the second feature, or merely indicates that the horizontal height of the first feature is less than that of the second feature.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples. In addition, different embodiments or examples and features of different embodiments or examples described in the specification may be combined by those skilled in the art without mutual contradiction.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from spirit, principles and scope of the present disclosure.

What is claimed is:

1. A device for testing a battery equalization circuit, wherein the battery equalization circuit comprises a plurality of equalization modules connected in series, each equalization module is corresponding to one battery cell, and the device comprises:
   a plurality of voltage supply modules, wherein each of the plurality of voltage supply modules is connected to a corresponding equalization module, so as to form a plurality of test loops, and each of the plurality of voltage supply modules is configured to simulate a voltage of the battery cell and to supply the voltage to a corresponding equalization module;
   a plurality of equalization current detection modules, wherein each of the plurality of equalization current detection modules is configured to detect equalization current of each test loop;
   a plurality of switch assemblies and a plurality of leakage current detection modules, wherein each of the plurality of switch assemblies is connected in parallel with a corresponding one of the plurality of leakage current detection modules to control a connection state of the corresponding one of the plurality of leakage current detection modules, and each of the plurality of leakage current detection modules is configured to detect leakage current generated by a corresponding equalization module when the leakage current detection module is connected into a corresponding test loop, wherein, when the switch assembly is turned off, the corresponding leakage current detection module is connected into the corresponding test loop; when the switch assembly is turned on, the corresponding leakage current detection module is not connected into the corresponding test loop; and
   a control module, configured to control each of the plurality of switch assemblies and each of the plurality of equalization modules so as to detect the equalization current and the leakage current of each test loop, wherein, when the equalization module in one test loop is controlled to turn on and any equalization module leakage current detection module is not connected into the corresponding test loop, the corresponding equalization current detection modules is configured to detect the equalization current of the corresponding test loop; when the equalization module in one test loop is controlled to turn off and the corresponding equalization module leakage current detection module is connected into the corresponding test loop, the corresponding equalization current detection modules is configured to detect the equalization current of the corresponding test loop, the corresponding leakage current detection modules is configured to detect the leakage current generated by the corresponding equalization module.

2. The device according to claim 1, wherein each of the plurality of leakage current detection modules comprises:
   a sampling resistor, connected in parallel with the corresponding switch assembly;
   a voltmeter, connected in parallel with the sampling resistor, and configured to detect a voltage over the sampling resistor to measure the leakage current generated by the corresponding equalization module.

3. The device according to claim 2, wherein each of the plurality of switch assemblies comprises:
   a relay, wherein a switch of the relay is connected in the corresponding test loop, and is connected in parallel with the corresponding sampling resistor, a first end of a coil of the relay is grounded, and a second end of the coil of the relay is connected with the control module via a drive unit.

4. The device according to claim 3, wherein each of the plurality of equalization modules comprises a load resistor and a MOS transistor connected in series.

5. The device according to claim 4, wherein the plurality of equalization modules comprise a first equalization module and a second equalization module, the plurality of voltage supply modules comprise a first voltage supply module and a second voltage supply module, the plurality of equalization current detection modules comprise a first equalization current detection module and a second equalization current detection module, the plurality of switch assemblies comprise a first switch assembly and a second switch assembly, the plurality of leakage current detection modules comprise a first leakage current detection module and a second leakage current detection module,
   a gate of a first MOS transistor in the first equalization module is connected with the control module, and a drain of the first MOS transistor is connected with a first end of a first load resistor in the first equalization module;

a first end of a coil of a first relay in the first switch assembly is grounded, a second end of the coil of the first relay is connected with the control module via a first drive unit, a first end of a switch of the first relay is connected with a source of the first MOS transistor;

a first end of the first equalization current detection module is connected with a second end of the switch of the first relay;

a first end of the first voltage supply module is connected with a second end of the first equalization current detection module;

a gate of a second MOS transistor in the second equalization module is connected with the control module, a source of the second MOS transistor is connected with a second end of the first load resistor, and a drain of the second MOS transistor is connected with a first end of a second load resistor in the second equalization module, in which a first node exists between the second MOS transistor and the first load resistor;

a first end of a coil of a second relay in the second switch assembly is grounded, a second end of the coil of the second relay is connected with the control module via a second drive unit, and a first end of a switch of the second relay is connected with the first node;

a first end of the second equalization current detection module is connected with a second end of the first voltage supply module, a second node exists between the second equalization current detection module and the first voltage supply module, and a second end of the switch of the second relay is connected with the second node;

a first end of the second voltage supply module is connected with a second end of the second equalization current detection module, and a second end of the second voltage supply module is connected with a second end of the second load resistor;

a first sampling resistor in the first leakage current detection module is connected in parallel with the switch of the first relay, and a first voltmeter in the first leakage current detection module is connected in parallel with the first sampling resistor; and a second sampling resistor in the second leakage current detection module is connected in parallel with the switch of the second relay, and a second voltmeter in the second leakage current detection module is connected in parallel with the second sampling resistor.

6. The device according to claim 5, wherein when the control module controls the first MOS transistor, the switch of the first relay and the switch of the second relay to turn on, the equalization current in a first test loop formed by the first voltage supply module, the first MOS transistor, and the first load resistor is detected by the first equalization current detection module; and when the control module controls the first MOS transistor and the switch of the first relay to turn off and controls the switch of the second relay to turn on, the leakage current of the first MOS transistor is detected by the first voltmeter.

7. The device according to claim 5, wherein when the control module controls the second MOS transistor and the switch of the second relay to turn on, the equalization current in a second test loop formed by the second voltage supply module, the second MOS transistor, and the second load resistor is detected by the second equalization current detection module; and when the control module controls the second MOS transistor and the switch of the second relay to turn off, the leakage current of the second MOS transistor is detected by the second voltmeter.

8. A method for testing a battery equalization circuit, wherein the battery equalization circuit comprises a plurality of equalization modules connected in series, each equalization module is corresponding to one battery cell, each of the plurality of equalization modules is connected to a corresponding voltage supply module, so as to form a plurality of test loops, each voltage supply module is configured to simulate a voltage of the battery cell and to supply the voltage to the corresponding equalization module, wherein, when the switch assembly is turned off, the corresponding leakage current detection module is connected into the corresponding test loop; when the switch assembly is turned on, the corresponding leakage current detection module is not connected into the corresponding test loop, and the method comprises:

detecting equalization current of each test loop by a corresponding equalization current detection module;

detecting leakage current generated by the equalization module by a corresponding leakage current detection module when the corresponding leakage current detection module is connected into the corresponding test loop, wherein the leakage current detection module is connected into the corresponding test loop via a corresponding switch assembly; and controlling each switch assembly and each of the plurality of equalization modules to detect the equalization current and the leakage current of each test loop, wherein, when the equalization module in one test loop is controlled to turn on and any equalization module leakage current detection module is not connected into the corresponding test loop, the corresponding equalization current detection modules is configured to detect the equalization current of the corresponding test loop; when the equalization module in one test loop is controlled to turn off and the corresponding equalization module leakage current detection module is connected into the corresponding test loop, the corresponding equalization current detection modules is configured to detect the equalization current of the corresponding test loop, the corresponding leakage current detection modules is configured to detect the leakage current generated by the corresponding equalization module.

9. The method according to claim 8, wherein when the plurality of equalization modules comprise a first equalization module and a second equalization module, there are a first voltage supply module and a second voltage supply module, a first equalization current detection module and a second equalization current detection module, a first switch assembly and a second switch assembly, and a first leakage current detection module and a second leakage current detection module, controlling each switch assembly and each of the plurality of equalization modules to detect the equalization current and the leakage current of each test loop comprises:

controlling a first MOS transistor in the first equalization module, a switch of a first relay in the first switch assembly and a switch of a second relay in the second switch assembly to turn on, and detecting the equalization current in a first test loop formed by the first voltage supply module and the first equalization module by the first equalization current detection module; and controlling the first MOS transistor and the switch of the first relay to turn off and controlling the switch of the second relay to turn on, and detecting the leakage current of the first MOS transistor by a first voltmeter in the first leakage current detection module.

10. The method according to claim 8, wherein when the plurality of equalization modules comprise a first equalization module and a second equalization module, there are a first voltage supply module and a second voltage supply module, a first equalization current detection module and a second equalization current detection module, a first switch assembly and a second switch assembly, and a first leakage current detection module and a second leakage current detection module, controlling each switch assembly and each of the plurality of equalization modules to detect the equalization current and the leakage current of each test loop comprises:
controlling a second MOS transistor in the second equalization module and a switch of a second relay in the second switch assembly to turn on, and detecting the equalization current in a second test loop formed by the second voltage supply module and the second equalization module by the second equalization current detection module; and
controlling the second MOS transistor and the switch of the second relay to turn off, and detecting the leakage current of the second MOS transistor by a second voltmeter in the second leakage current detection module.

11. A device for testing a battery equalization circuit, wherein the battery equalization circuit comprises a plurality of equalization modules connected in series, each equalization module is corresponding to one battery cell, and the device comprises:
a plurality of voltage supply modules, wherein each of the plurality of voltage supply modules is connected to a corresponding equalization module, so as to form a plurality of test loops, and each of the plurality of voltage supply modules is configured to simulate a voltage of the battery cell and to supply the voltage to a corresponding equalization module;
a plurality of equalization current detection modules, wherein each of the plurality of equalization current detection modules is configured to detect equalization current of each test loop;
a plurality of switch assemblies and a plurality of leakage current detection modules, wherein each of the plurality of switch assemblies is connected in parallel with a corresponding one of the plurality of leakage current detection modules to control a connection state of the corresponding one of the plurality of leakage current detection modules, and each of the plurality of leakage current detection modules is configured to detect leakage current generated by a corresponding equalization module when the leakage current detection module is connected into a corresponding test loop; and
a control module, configured to control each of the plurality of switch assemblies and each of the plurality of equalization modules so as to detect the equalization current and the leakage current of each test loop,
wherein each of the plurality of leakage current detection modules comprises:
a sampling resistor, connected in parallel with the corresponding switch assembly;
a voltmeter, connected in parallel with the sampling resistor, and configured to detect a voltage over the sampling resistor to measure the leakage current generated by the corresponding equalization module;
wherein each of the plurality of switch assemblies comprises:
a relay, wherein a switch of the relay is connected in the corresponding test loop, and is connected in parallel with the corresponding sampling resistor, a first end of a coil of the relay is grounded, and a second end of the coil of the relay is connected with the control module via a drive unit;
wherein each of the plurality of equalization modules comprises a load resistor and a MOS transistor connected in series; and
wherein the plurality of equalization modules comprise a first equalization module and a second equalization module, the plurality of voltage supply modules comprise a first voltage supply module and a second voltage supply module, the plurality of equalization current detection modules comprise a first equalization current detection module and a second equalization current detection module, the plurality of switch assemblies comprise a first switch assembly and a second switch assembly, the plurality of leakage current detection modules comprise a first leakage current detection module and a second leakage current detection module,
a gate of a first MOS transistor in the first equalization module is connected with the control module, and a drain of the first MOS transistor is connected with a first end of a first load resistor in the first equalization module;
a first end of a coil of a first relay in the first switch assembly is grounded, a second end of the coil of the first relay is connected with the control module via a first drive unit, a first end of a switch of the first relay is connected with a source of the first MOS transistor;
a first end of the first equalization current detection module is connected with a second end of the switch of the first relay;
a first end of the first voltage supply module is connected with a second end of the first equalization current detection module;
a gate of a second MOS transistor in the second equalization module is connected with the control module, a source of the second MOS transistor is connected with a second end of the first load resistor, and a drain of the second MOS transistor is connected with a first end of a second load resistor in the second equalization module, in which a first node exists between the second MOS transistor and the first load resistor;
a first end of a coil of a second relay in the second switch assembly is grounded, a second end of the coil of the second relay is connected with the control module via a second drive unit, and a first end of a switch of the second relay is connected with the first node;
a first end of the second equalization current detection module is connected with a second end of the first voltage supply module, a second node exists between the second equalization current detection module and the first voltage supply module, and a second end of the switch of the second relay is connected with the second node;
a first end of the second voltage supply module is connected with a second end of the second equalization current detection module, and a second end of the second voltage supply module is connected with a second end of the second load resistor;
a first sampling resistor in the first leakage current detection module is connected in parallel with the switch of the first relay, and a first voltmeter in the first leakage current detection module is connected in parallel with the first sampling resistor; and a second sampling resistor in the second leakage current detection module is connected in parallel with the switch of the second relay, and a second voltmeter in the second leakage current detection module is connected in parallel with the second sampling resistor.

12. The device according to claim 11, wherein when the control module controls the first MOS transistor, the switch of the first relay and the switch of the second relay to turn on, the equalization current in a first test loop formed by the first voltage supply module, the first MOS transistor, and the first load resistor is detected by the first equalization current detection module; and when the control module controls the first MOS transistor and the switch of the first relay to turn off and controls the switch of the second relay to turn on, the leakage current of the first MOS transistor is detected by the first voltmeter.

13. The device according to claim 11, wherein when the control module controls the second MOS transistor and the switch of the second relay to turn on, the equalization current in a second test loop formed by the second voltage supply module, the second MOS transistor, and the second load resistor is detected by the second equalization current detection module; and when the control module controls the second MOS transistor and the switch of the second relay to turn off, the leakage current of the second MOS transistor is detected by the second voltmeter.

14. A method for testing a battery equalization circuit, wherein the battery equalization circuit comprises a plurality of equalization modules connected in series, each equalization module is corresponding to one battery cell, each of the plurality of equalization modules is connected to a corresponding voltage supply module, so as to form a plurality of test loops, each voltage supply module is configured to simulate a voltage of the battery cell and to supply the voltage to the corresponding equalization module, and the method comprises:

detecting equalization current of each test loop by a corresponding equalization current detection module;

detecting leakage current generated by the equalization module by a corresponding leakage current detection module when the corresponding leakage current detection module is connected into the corresponding test loop, wherein the leakage current detection module is connected into the corresponding test loop via a corresponding switch assembly; and controlling each switch assembly and each of the plurality of equalization modules to detect the equalization current and the leakage current of each test loop;

wherein when the plurality of equalization modules comprise a first equalization module and a second equalization module, there are a first voltage supply module and a second voltage supply module, a first equalization current detection module and a second equalization current detection module, a first switch assembly and a second switch assembly, and a first leakage current detection module and a second leakage current detection module, controlling each switch assembly and each of the plurality of equalization modules to detect the equalization current and the leakage current of each test loop comprises:

controlling a first MOS transistor in the first equalization module, a switch of a first relay in the first switch assembly and a switch of a second relay in the second switch assembly to turn on, and detecting the equalization current in a first test loop formed by the first voltage supply module and the first equalization module by the first equalization current detection module; and controlling the first MOS transistor and the switch of the first relay to turn off and controlling the switch of the second relay to turn on, and detecting the leakage current of the first MOS transistor by a first voltmeter in the first leakage current detection module.

15. The method according to claim 14, wherein when the plurality of equalization modules comprise a first equalization module and a second equalization module, there are a first voltage supply module and a second voltage supply module, a first equalization current detection module and a second equalization current detection module, a first switch assembly and a second switch assembly, and a first leakage current detection module and a second leakage current detection module, controlling each switch assembly and each of the plurality of equalization modules to detect the equalization current and the leakage current of each test loop comprises:

controlling a second MOS transistor in the second equalization module and a switch of a second relay in the second switch assembly to turn on, and detecting the equalization current in a second test loop formed by the second voltage supply module and the second equalization module by the second equalization current detection module; and controlling the second MOS transistor and the switch of the second relay to turn off, and detecting the leakage current of the second MOS transistor by a second voltmeter in the second leakage current detection module.

* * * * *